United States Patent

Hanada et al.

[11] Patent Number: 5,702,814
[45] Date of Patent: Dec. 30, 1997

[54] GOLD WIRE FOR BONDING

[75] Inventors: Shinichi Hanada; Koichiro Mukoyama, both of Tokyo, Japan

[73] Assignee: Tanaka Denshi Kogyo Kabushiki Kaisha, Tokyo, Japan

[21] Appl. No.: 587,747

[22] Filed: Jan. 17, 1996

[30] Foreign Application Priority Data

May 17, 1995 [JP] Japan ................................. 7-118521
Dec. 7, 1995 [JP] Japan ................................. 7-319059

[51] Int. Cl.$^6$ ........................................... C22C 5/02
[52] U.S. Cl. .................. 428/364; 428/606; 420/507; 420/510; 420/511
[58] Field of Search ........................... 428/606, 364; 420/507, 510, 511

[56] References Cited

U.S. PATENT DOCUMENTS

| | | |
|---|---|---|
| 4,330,329 | 5/1982 | Hayashi et al. |
| 4,775,512 | 10/1988 | Fukui et al. ........................ 420/507 |
| 4,885,135 | 12/1989 | Hosoda et al. ..................... 420/507 |
| 4,938,923 | 7/1990 | Kujiraoka et al. ................. 420/509 |
| 5,071,619 | 12/1991 | Hosoda et al. |
| 5,366,692 | 11/1994 | Ogashiwa . |
| 5,384,090 | 1/1995 | Ogashiwa . |

FOREIGN PATENT DOCUMENTS

| | | |
|---|---|---|
| 5-9624 | 1/1993 | Japan . |
| 2063913 | 6/1981 | United Kingdom . |
| 2116208 | 9/1983 | United Kingdom . |
| 2201545 | 9/1988 | United Kingdom . |
| 2262746 | 6/1993 | United Kingdom . |

OTHER PUBLICATIONS

Patent Abstracts of Japan, vol. 017, No. 274 (C-1064).
European Search Report and Annex to the Serach Report.
English Language Abstract of Japanese Application No. 5-9624.
English Langauge Abstract of Japanese Application No. 63-145729.
English Langauge Abstract of Japanese Application No. 3-283541.
English Langauge Abstract of Japanese Application No. 61-60842.

*Primary Examiner*—Kathleen Choi
*Attorney, Agent, or Firm*—Greenblum & Bernstein, P.L.C.

[57] ABSTRACT

According to the present invention provided is a gold wire for IC chip bonding which wire is unlikely to be broken after thermosonic wire bonding at an increased ultrasonic output, subsequent reverse deformation involving severe bonding and deformation of a ball neck portion and formation of a loop. The bonding gold wire essentially consists of 0.0001–0.005 wt % of Pt, 0.0001–0.005 wt % of Ag, 0.0005–0.005 wt % of Mg and 0.00005–0.005 wt % of Eu; with the balance being Au, said Au having less than 0.001% by weight of incidental impurity.

8 Claims, 1 Drawing Sheet

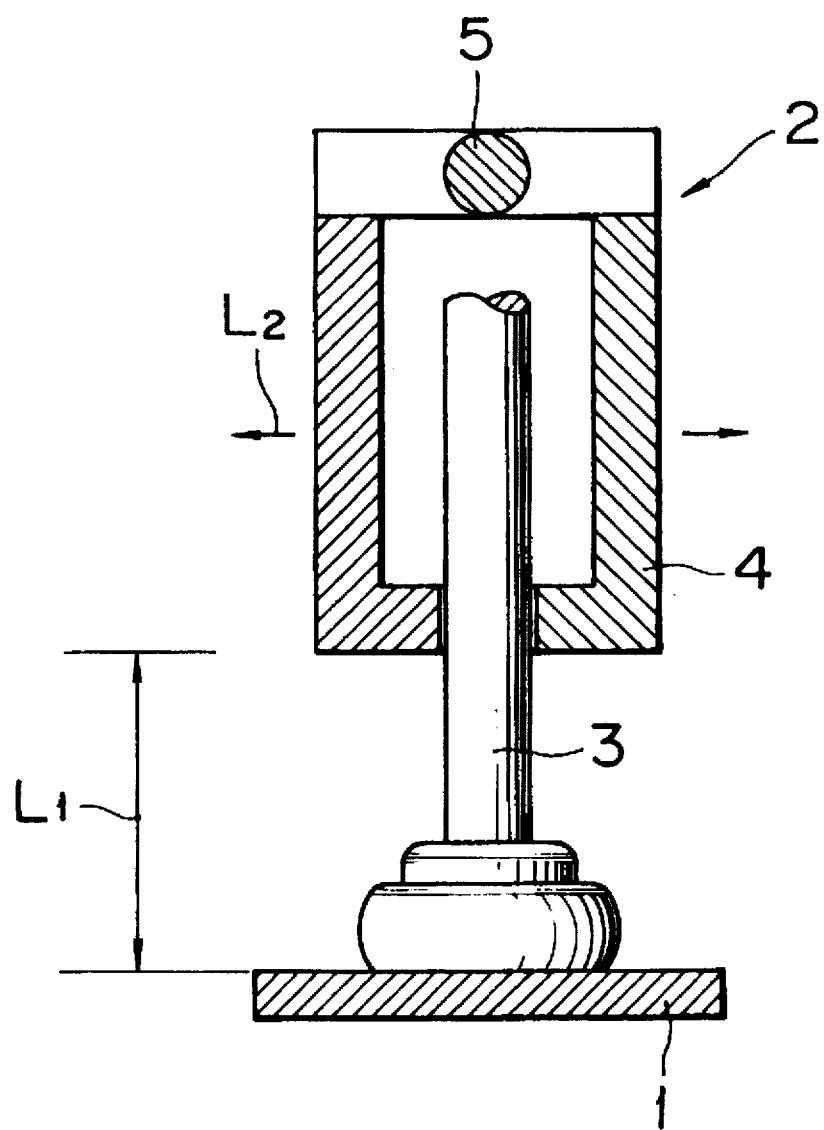

GOLD WIRE FOR BONDING

BACKGROUND OF THE INVENTION

The present invention relates to a gold bonding wire to be used for connection between each electrode and outer lead portion of an IC chip. More particularly, the invention is concerned with an IC chip gold bonding wire capable of greatly reducing the degree of damage of a bonding wire neck portion caused by, for example, an increase of an ultrasonic output at the time of assembling a semiconductor device.

Heretofore, as the method for connection between electrodes and outer lead portions on an IC chip, there has mainly been used a thermosonic wire bonding method which employs a gold wire. With the recent demand for high speed and higher function of a semiconductor device and consequent increase in the number of electrodes and outer leads, the wiring distance from the electrodes to the leads has become longer. On the other hand, as a measure for reducing the size and thickness of a semiconductor device, the distance between an electrode and an outer lead wiring is made extremely short.

As a result, it is required that the wiring be short despite the use of many lead wires. To meet this demand, in the course of forming a loop by the use of a bonding device, there has been made an attempt to stabilize the loop height and the loop shape by performing what is called reverse deformation, that is, by bending and deforming a ball neck portion severely in the direction opposite to the loop forming direction and thereafter stretching a loop.

However, when the loop formed by such reverse deformation is exposed to a heat cycle environment involved in the generation of heat from a semiconductor device at the stage of operation of device, there occurs the problem of disconnection at the ball neck portion.

In order to prevent such disconnection during operation of the semiconductor device, there is now a demand for developing a gold wire which, when the ball neck portion is bent and deformed severely and a loop is stretched, does not undergo disconnection in a subsequent heat cycle test which is conducted to a severe extent.

There has heretofore been proposed the incorporation of Eu, Ca, Ge and Be each in a predetermined amount into a gold wire for the purpose of remedying the problem that the neck portion just above a gold ball is broken by vibration (see Japanese Patent Laid-Open No. 9624/93).

However, such conventional bonding wire as proposed above is not considered satisfactory as a gold wire that is little disconnected at the ball neck portion when exposed to a severe heat cycle environment, vibration and impact after severe bending and deformation at the ball neck portion and subsequent stretching of a loop.

SUMMARY OF THE INVENTION

The present invention has been accomplished in view of the aforementioned circumstances and it is the object of the invention to provide a gold wire for IC chip bonding which gold wire is not broken even when exposed to a severe heat cycle environment and which the neck portion just above a gold ball is broken by vibration and impact after thermosonic bonding at an enhanced ultrasonic wave output and subsequent stretching of a loop, that is, after performing what is called reverse deformation.

Having made extensive studies, the present inventors found that by making a gold alloy wire consisted essentially of platinum (Pt), silver (Ag), magnesium (Mg) and europium (Eu) each in a predetermined amount, with the balance being gold (Au), said gold having less than 0.001% by weight of incidental impurity, the above-mentioned purpose could be attained by a synergistic effect of those elements. In this way we completed the present invention.

More specifically, the present invention, in the first aspect thereof, resides in a gold wire for use in the bonding of IC chip, consisting essentially of from platinum (Pt): 0.0001–0.005 wt %, silver (Ag): 0.0001–0.005 wt %, magnesium (Mg): 0.0005–0.005 wt % and europium (Eu): 0.00005–0.005 wt %; with the balance being gold (Au), said gold (Au) having less than incidental impurity: 0.001 wt %.

The present invention, in the second aspect thereof, resides in a gold wire for use in the bonding of IC chip according to the first aspect thereof, further consisting essentially of at least one additional element selected from the group consisting of from beryllium (Be): 0.00002–0.001 wt %, calcium (Ca): 0.00005–0.004 wt %, germanium (Ge): 0.0005–0.01 wt %.

Further, the present invention, in the third aspect thereof, resides in a gold wire for use in the bonding of IC chip according to the first aspect thereof, further consisting essentially of from 0.0001–0.02 wt % selected from lantanum (La), yttrium (Y), lead (Pb), erbium (Er), gadolinium (Gd), cerium (Ce), praseodymium (Pr), neodymium (Nd) and samarium (Sm).

Further, the present invention, in the fourth aspect thereof, resides in a gold wire for use in the bonding of IC chip according to the second aspect thereof, further consisting essentially of from 0.0001–0.02 wt % selected from lantanum (La), yttrium (Y), lead (Pb), erbium (Er), gadolinium (Gd), cerium (Ce), praseodymium (Pr), neodymium (Nd) and samarium (Sm).

Further, the present invention, in the fifth aspect thereof, resides in a gold wire for use in the bonding of IC chip according to the first aspect thereof, wherein Ag content is from 0.0005–0.005 wt %.

Further, the present invention, in the sixth aspect thereof, resides in a gold wire for use in the bonding of IC chip according to the second aspect thereof, wherein Ag content is from 0.0005–0.005 wt %.

Further, the present invention, in the seventh aspect thereof, resides in a gold wire for use in the bonding of IC chip according to the third aspect thereof, wherein Ag content is from 0.0005–0.005 wt %.

Further, the present invention, in the eighth aspect thereof, resides in a gold wire for use in the bonding of IC chip according to the fourth aspect thereof, wherein Ag content is from 0.0005 . 0.005 wt %.

BRIEF DESCRIPTION OF THE DRAWING

FIG. 1 is a schematic diagram showing an outline of an oscillation test according to the present invention.

DETAILED DESCRIPTION OF THE INVENTION

As mentioned above, the bonding gold wire according to the present invention has a composition containing a first group of Pt, Ag, Mg and Eu each in a predetermined amount, or a second group which comprises at least one member selected from Be, Ca and Ge each in a predetermined amount, or a third group which comprises a predetermined amount of at least one member selected from La, Y, P, Er, Gd, Ce, Pr, Nd and Sm.

The following description is now provided about a detailed construction of the present invention and the operation thereof.

In the present invention, by making a gold alloy wire consisted essentially of platinum (Pt), silver (Ag), magnesium (Mg) and europium (Eu) each so as to give the foregoing construction, with the balance being gold (Au), said gold having less than 0.001% by weight of incidental impurity, there can be obtained, by virtue of a synergistic effect of those metal elements, a gold alloy wire superior in reliability and breaking performance when exposed to a heat cycle environment, vibration and impact, of a neck portion thereof as a bonding wire after thermosonic wire bonding at an enhanced ultrasonic wave output and after reverse deformation to form a loop. The reason why the composition of the gold alloy wire of the present invention is limited as above will be stated below.

First group; Pt

In combination with Ag, Mg and Eu, Pt exhibits an excellent effect in improving the reliability of the ball neck portion.

At a Pt content of not lower than 0.0001 wt %, in comparison with a Pt content lower than 0.0001 wt %, the ball neck portion becomes more reliable, and if the Pt content exceeds 0.005 wt %, it will become no longer possible to effect ball formation. For this reason the Pt content has been limited in the range of 0.0001 to 0.005 wt %.

In comparison with the case where any one of Ag, Mg and EU is not present while Pt is present in an amount within the above range, the reliability of the ball neck portion is improved in the presence of Pt with Ag, Mg and Eu. It is thus necessary that Pt be used in the presence of Ag, Mg and Eu.

A more preferred composition comprises the elements plus at least one member selected from Be, Ca and Ge each in a predetermined amount. In this composition the reliability of the ball neck portion is further improved.

First group; Ag

In combination with Pt, Mg and Eu, Ag exhibits an excellent effect in improving the reliability of the ball neck portion.

At an Ag content of not lower than. 0.0001 wt %, in comparison with an Ag content of lower than 0.0001 wt %, the ball neck portion gets more reliable. A more preferred range of Ag content is more than 0.0005 wt % in which range the reliability of the ball neck portion is further improved under breaking ratio by impact test. If the Ag content exceeds 0.005 wt %, it is impossible to effect ball formation to a satisfactory extent. For this reason, the Ag content is specified in the range of 0.0001 to 0.05 wt %.

In comparison with the case where Ag is present in an amount within the above range but any one of Pt, Mg and Eu is not present, the use of Ag contributes to the improvement of reliability of the ball neck portion in the presence of all of Pt, Mg and Eu. It is necessary that Ag be used in combination with Pt, Mg and According to a more preferred composition, at least one of Be, Ca and Ge is used in a predetermined amount in addition to the above elements. This composition is more effective in improving the reliability of the neck portion.

First group; Mg

Mg, in combination with Pt, Ag and Eu, exhibits an excellent effect in improving the reliability of the ball neck portion.

If the Mg content is not lower than 0.0005 wt %, the reliability of the ball neck portion is improved in comparison with the case where the Mg content is lower than 0.0005 wt %. If the Mg content exceeds 0.005 wt %, not only it is no longer possible to effect ball formation to a satisfactory extent but also cracking is generated at chip electrodes at the time of bonding. For this reason, the Mg content has been specified in the range of 0.0005 to 0.005 wt %.

In comparison with the case where Mg is used in an amount within the above range while any one of Pt, Ag and Eu is not used, the use of Mg results in improved reliability of the ball neck portion in the presence of all of Pt, Ag and Eu. It is thus necessary to use Mg in combination with Pt, Ag and Eu.

According to a more preferred composition, at least any one of Be, Ca and Ge is used in a predetermined amount in addition to the above elements. This composition is more effective in improving the reliability of the ball neck portion.

First group; Eu

Eu, in combination with Pt, Ag and Mg, exhibits an excellent effect in improving the reliability of the ball neck portion.

If the Eu content is not lower than 0.00005 wt %, in comparison with an Eu content lower than 0.00005 wt %, the reliability of the ball neck portion is improved, and a further improvement of the reliability is attained at an Eu content of not lower than 0.0001 wt %. If the Eu content exceeds 0.005 wt %, cracking occurs at chip electrodes at the time of bonding. For this reason, the Eu content has been specified in the range of 0.00005 to 0.005 wt %.

In comparison with the case where any one of Pt, Ag and Mg is not present even with Eu present in an amount within the above range, the use of Eu contributes to the improvement in reliability of the ball neck portion in combination of all of Pt, Ag and Mg. It is necessary to use Eu in combination with Pt, Ag and Mg.

A more preferred range of Eu content is 0.0001 to 0.005 wt % in which range the reliability of the ball neck portion is further improved.

A more preferred composition comprises the above elements and at least one of Be, Ca and Ge in a predetermined amount. This composition is more effective in improving the reliability of the ball neck portion.

Second group; Be, Ca, Ge

Using at least one member selected from 0.00002–0.001 wt % of Be, 0.00005–0.004 wt % of Ca and 0.0005–0.01 wt % of Ge in combination with Pt, Ag, Mg and Eu is preferred because a further improvement in reliability of the ball neck portion will result.

Such further improvement is not attained if the Be content is lower than 0.00002 wt %, the Ca content lower than 0.00005 wt % and Ge content lower than 0.0005 wt %.

If the Be content exceeds 0.001 wt %, it is no longer possible to effect ball formation to a satisfactory extent.

This is also true of the case where the Ca content is higher than 0.004 wt %.

At a Ge content exceeding 0.01 wt %, electrode cracking will occur more easily at the time of bonding.

For the above reasons there have been specified the Be content in the range of 0.00002 to 0.001 wt %, Ca content 0.00005 to 0.004 wt % and Ge content 0.0005 to 0.01 wt %.

Third group; La, Y, Pb, Er, Gd, Ce, Pr, Nd, Sm

If at least one of the third group components which are La, Y, Pb, Er, Gd, Ce, Pr, Nd and Sm is used in an amount of 0.0001 to 0.02 wt % in addition to the first group components, an equal effect is attained to that attained by the composition which contains only the first group component with respect to the reliability of the ball neck portion.

In this case, even if a component of the third group is present, there a high reliability of the ball neck portion is not attained if any of the first group components, i.e., Pt, Ag, Mg and Eu, is not present.

Further, if at least one of the third group components which are La, Y, Pb, Er, Gd, Ce, Pr, Nd and Sm is used by an amount of 0.0001 to 0.02 wt % in addition to the first and second group components, an equal or superior effect is attained to that attained by the composition which contains both first and second group components, with respect to the reliability of the ball neck portion.

In this case, if any one of the first group components, Pt, Ag, Mg and Eu, is not used, a high reliability of the ball neck portion is not attained even with the second and third components are used.

Examples

The following description is now provided about working examples and comparative examples shown in Tables 1 to 16.

Example 1

By adding Pt, Ag, Mg and Eu in the predetermined amount to 99.999 wt % of high purity gold and melt it in a smelting furnace and then cast, gold alloy comprising the composition shown in the table, namely, Pt: 1 ppm, Ag: 10 ppm, Mg: 20 ppm and Eu: 10 ppm, with the balance being Au, said Au having less than incidental impurity: 10 ppm. Gold working using grooved rolls and a wise drawing machine and heat treatment are repeated to finish into a fine wire 30 μm in final diameter and 4% elongation. Using this fine wire as a bonding wire and using an automatic high-speed bonder, a thermosonic wire bonding is performed onto IC chip electrodes. After initial ball bonding at an ultrasonic output of 0.5 W, the capillary is once moved in the direction opposite to the loop forming direction and that reverse angle was set at 60° relative to the vertical direction to bend and deform the ball neck portion severely, followed by bonding with outer leads and formation of a regular loop (wiring). The test material for wiring is 40 pins for 1 IC chip, namely 40 pieces wiring are made.

Next, the shape of ball is checked, electrode cracking is checked, a heat cycle test is conducted, vibration test is conducted, and impact test is conducted. Measurement results obtained are as shown in Table 2.

Examples 2–159 and Comparative Examples 1–22

Fine wires are finished and the aforementioned each tests were performed in the same way as in Example 1 except that the composition of gold alloy is used as shown in the tables. The results obtained are as set out in Tables 2, 4, 6, 8, 11, 14 and 16.

The following methods are adopted for the measurements and evaluations.

Ball shape

Using an electric torch incorporated in an automatic high-speed bonder, a gold ball is formed, and then using a scanning type electron microscope, the size, sphericity and surface condition of the gold ball were observed.

The size of the gold ball is measured on the basis of 2.5 times that wire diameter, namely, 75 μm φ, while the sphericity and surface condition are evaluated in comparison with control samples. When all of ten samples measured are good, the result is indicated as "good", while when even one of them is defective, the result is indicated as "bad".

Electrode Cracking in Bonding

When there is no electrode cracking in a 100 wiring samples conducted using an automatic high-speed bonder, the result is indicated as "good", while when even one ball was cracked in the same test, the result is indicated as "bad".

Heat Cycle Test

After sealing the wiring samples with an epoxy resin, heat cycle tests of –10° C., 30 minutes and 150° C. for 30 minutes are conducted by 2000 times. 100 samples are used in the test and disconnection is checked by a conduction test. The number of sample which has been disconnected is indicated in terms of breaking ratio (%).

Vibration Test

Bonding is performed by use of a silver-plated lead frame 1 in place of the IC chip electrodes, wired in the same way as in Example 1, then cut bonding portion of outer lead side and make the samples illustrated in FIG. 1, and the thus-obtained samples are used in a vibration test.

Using a vibration tester 2 illustrated in FIG. 1, a vibration test is conducted under the following conditions, in which a test wire 3 with the front end thereof bonded to the lead frame 1 is oscillated both right and left around a shaft 5 by means of a wire supporting portion 4. And the number of times of oscillation up to breaking was measured.

Span ($L_1$):150 μm

Both-side Amplitude ($L_2$):26 μm

Oscillation Frequency:40 Hz (40 times/sec)

The same test was repeated three times and a mean value obtained was indicated.

Impact test 6 wiring samples (the total number of wire is 240) are made and perform impact accelerated test. Namely, set the samples into magazine, drop it from a level 100 mm high and check the number of broken wire by a light microscope. The breaking ratio is shown as the following formula.

$$\text{Breaking ratio} = \frac{\text{the number of broken wire}}{240} \times 100(\%)$$

TABLE 1

| Example | Composition (ppm by weight) | | | | | | | |
|---|---|---|---|---|---|---|---|---|
|  | Pt | Ag | Mg | Eu | Be | Ca | Ge | Au |
| 1 | 1 | 10 | 20 | 10 | — | — | — | balance |
| 2 | 10 | 10 | 20 | 10 | — | — | — | balance |
| 3 | 50 | 10 | 20 | 10 | — | — | — | balance |
| 4 | 10 | 1 | 20 | 10 | — | — | — | balance |
| 5 | 10 | 5 | 20 | 10 | — | — | — | balance |
| 6 | 10 | 50 | 20 | 10 | — | — | — | balance |
| 7 | 10 | 10 | 5 | 10 | — | — | — | balance |
| 8 | 10 | 10 | 50 | 10 | — | — | — | balance |
| 9 | 10 | 10 | 20 | 0.5 | — | — | — | balance |
| 10 | 10 | 10 | 20 | 1 | — | — | — | balance |
| 11 | 10 | 10 | 20 | 50 | — | — | — | balance |
| 12 | 1 | 10 | 20 | 10 | 5 | — | — | balance |
| 13 | 10 | 10 | 20 | 10 | 5 | — | — | balance |
| 14 | 50 | 10 | 20 | 10 | 5 | — | — | balance |
| 15 | 10 | 1 | 20 | 10 | 5 | — | — | balance |
| 16 | 10 | 5 | 20 | 10 | 5 | — | — | balance |
| 17 | 10 | 50 | 20 | 10 | 5 | — | — | balance |
| 18 | 10 | 10 | 5 | 10 | 5 | — | — | balance |
| 19 | 10 | 10 | 50 | 10 | 5 | — | — | balance |
| 20 | 10 | 10 | 20 | 0.5 | 5 | — | — | balance |
| 21 | 10 | 10 | 20 | 1 | 5 | — | — | balance |
| 22 | 10 | 10 | 20 | 50 | 5 | — | — | balance |
| 23 | 10 | 10 | 20 | 10 | 0.2 | — | — | balance |
| 24 | 10 | 10 | 20 | 10 | 10 | — | — | balance |
| 25 | 1 | 10 | 20 | 10 | — | 10 | — | balance |
| 26 | 10 | 10 | 20 | 10 | — | 10 | — | balance |
| 27 | 50 | 10 | 20 | 10 | — | 10 | — | balance |
| 28 | 10 | 1 | 20 | 10 | — | 10 | — | balance |
| 29 | 10 | 5 | 20 | 10 | — | 10 | — | balance |
| 30 | 10 | 50 | 20 | 10 | — | 10 | — | balance |
| 31 | 10 | 10 | 5 | 10 | — | 10 | — | balance |
| 32 | 10 | 10 | 50 | 10 | — | 10 | — | balance |
| 33 | 10 | 10 | 20 | 0.5 | — | 10 | — | balance |

TABLE 2

| Example | Ball shape | Electrode Cracking in Bonding | Reliability of Bonding Neck Portion | | |
|---|---|---|---|---|---|
| | | | Heat cycle test Breaking ratio (%) | Vibration test (×10³ times) | Impact test Breaking ratio (%) |
| 1 | good | good | 1 | 12.1 | 5 |
| 2 | good | good | 1 | 12.3 | 3 |
| 3 | good | good | 1 | 12.4 | 3 |
| 4 | good | good | 1 | 12.1 | 12 |
| 5 | good | good | 1 | 12.2 | 1 |
| 6 | good | good | 1 | 12.3 | 4 |
| 7 | good | good | 1 | 12.4 | 2 |
| 8 | good | good | 1 | 12.6 | 3 |
| 9 | good | good | 1 | 11.2 | 2 |
| 10 | good | good | 1 | 12.3 | 2 |
| 11 | good | good | 1 | 12.2 | 2 |
| 12 | good | good | 0 | 13.0 or more | 2 |
| 13 | good | good | 0 | 13.0 or more | 2 |
| 14 | good | good | 0 | 13.0 or more | 1 |
| 15 | good | good | 0 | 13.0 or more | 13 |
| 16 | good | good | 0 | 13.0 or more | 2 |
| 17 | good | good | 0 | 13.0 or more | 2 |
| 18 | good | good | 0 | 13.0 or more | 2 |
| 19 | good | good | 0 | 13.0 or more | 1 |
| 20 | good | good | 1 | 11.2 | 2 |
| 21 | good | good | 0 | 13.0 or more | 2 |
| 22 | good | good | 0 | 13.0 or more | 2 |
| 23 | good | good | 0 | 13.0 or more | 1 |
| 24 | good | good | 0 | 13.0 or more | 1 |
| 25 | good | good | 0 | 13.0 or more | 1 |
| 26 | good | good | 0 | 13.0 or more | 1 |
| 27 | good | good | 0 | 13.0 or more | 1 |
| 28 | good | good | 0 | 13.0 or more | 13 |
| 29 | good | good | 1 | 13.0 or more | 2 |
| 30 | good | good | 0 | 13.0 or more | 2 |
| 31 | good | good | 0 | 13.0 or more | 2 |
| 32 | good | good | 0 | 13.0 or more | 2 |
| 33 | good | good | 1 | 11.2 | 2 |

TABLE 3

| Example | Composition (ppm by weight) | | | | | | | |
|---|---|---|---|---|---|---|---|---|
| | Pt | Ag | Mg | Eu | Be | Ca | Ge | Au |
| 34 | 10 | 10 | 20 | 1 | — | 10 | — | balance |
| 35 | 10 | 10 | 20 | 50 | — | 10 | — | balance |
| 36 | 10 | 10 | 20 | 10 | — | 0.5 | — | balance |
| 37 | 10 | 10 | 20 | 10 | — | 40 | — | balance |
| 38 | 1 | 10 | 20 | 10 | — | — | 40 | balance |
| 39 | 10 | 10 | 20 | 10 | — | — | 40 | balance |
| 40 | 50 | 10 | 20 | 10 | — | — | 40 | balance |
| 41 | 10 | 1 | 20 | 10 | — | — | 40 | balance |
| 42 | 10 | 5 | 20 | 10 | — | — | 40 | balance |
| 43 | 10 | 50 | 20 | 10 | — | — | 40 | balance |
| 44 | 10 | 10 | 5 | 10 | — | — | 40 | balance |
| 45 | 10 | 10 | 50 | 10 | — | — | 40 | balance |
| 46 | 10 | 10 | 20 | 0.5 | — | — | 40 | balance |
| 47 | 10 | 10 | 20 | 1 | — | — | 40 | balance |
| 48 | 10 | 10 | 20 | 50 | — | — | 40 | balance |
| 49 | 10 | 10 | 20 | 10 | — | — | 5 | balance |
| 50 | 10 | 10 | 20 | 10 | — | — | 100 | balance |
| 51 | 1 | 10 | 20 | 10 | 5 | 10 | — | balance |
| 52 | 10 | 10 | 20 | 10 | 5 | 10 | — | balance |
| 53 | 50 | 10 | 20 | 10 | 5 | 10 | — | balance |
| 54 | 10 | 1 | 20 | 10 | 5 | 10 | — | balance |
| 55 | 10 | 5 | 20 | 10 | 5 | 10 | — | balance |
| 56 | 10 | 50 | 20 | 10 | 5 | 10 | — | balance |
| 57 | 10 | 10 | 5 | 10 | 5 | 10 | — | balance |
| 58 | 10 | 10 | 50 | 10 | 5 | 10 | — | balance |
| 59 | 10 | 10 | 20 | 0.5 | 5 | 10 | — | balance |
| 60 | 10 | 10 | 20 | 1 | 5 | 10 | — | balance |
| 61 | 10 | 10 | 20 | 50 | 5 | 10 | — | balance |
| 62 | 10 | 10 | 20 | 10 | 0.2 | 10 | — | balance |
| 63 | 10 | 10 | 20 | 10 | 10 | 10 | — | balance |
| 64 | 10 | 10 | 20 | 10 | 5 | 0.5 | — | balance |
| 65 | 10 | 10 | 20 | 10 | 5 | 40 | — | balance |

TABLE 4

| | Electrode | | Reliability of Bonding Neck Portion | | |
|---|---|---|---|---|---|
| Example | Ball shape | Cracking in Bonding | Heat cycle test Breaking ratio (%) | Vibration test (× 10³ times) | Impact test Breaking ratio (%) |
| 34 | good | good | 0 | 13.0 or more | 1 |
| 35 | good | good | 0 | 13.0 or more | 2 |
| 36 | good | good | 0 | 13.0 or more | 2 |
| 37 | good | good | 0 | 13.0 or more | 1 |
| 38 | good | good | 0 | 13.0 or more | 2 |
| 39 | good | good | 0 | 13.0 or more | 2 |
| 40 | good | good | 0 | 13.0 or more | 2 |
| 41 | good | good | 0 | 13.0 or more | 13 |
| 42 | good | good | 0 | 13.0 or more | 1 |
| 43 | good | good | 0 | 13.0 or more | 2 |
| 44 | good | good | 0 | 13.0 or more | 1 |
| 45 | good | good | 0 | 13.0 or more | 1 |
| 46 | good | good | 1 | 11.2 | 3 |
| 47 | good | good | 0 | 13.0 or more | 2 |
| 48 | good | good | 0 | 13.0 or more | 1 |
| 49 | good | good | 0 | 13.0 or more | 2 |
| 50 | good | good | 0 | 13.0 or more | 2 |
| 51 | good | good | 0 | 13.0 or more | 2 |
| 52 | good | good | 0 | 13.0 or more | 1 |
| 53 | good | good | 0 | 13.0 or more | 2 |
| 54 | good | good | 0 | 13.0 or more | 14 |
| 55 | good | good | 0 | 13.0 or more | 2 |
| 56 | good | good | 0 | 13.0 or more | 1 |
| 57 | good | good | 0 | 13.0 or more | 2 |
| 58 | good | good | 0 | 13.0 or more | 2 |
| 59 | good | good | 1 | 11.2 | 2 |
| 60 | good | good | 0 | 13.0 or more | 1 |
| 61 | good | good | 0 | 13.0 or more | 2 |
| 62 | good | good | 0 | 13.0 or more | 2 |
| 63 | good | good | 0 | 13.0 or more | 2 |
| 64 | good | good | 0 | 13.0 or more | 2 |
| 65 | good | good | 0 | 13.0 or more | 2 |

TABLE 5

| | Composition (ppm by weight) | | | | | | | |
|---|---|---|---|---|---|---|---|---|
| Example | Pt | Ag | Mg | Eu | Be | Ca | Ge | Au |
| 66 | 1 | 10 | 20 | 10 | 5 | — | 40 | balance |
| 67 | 10 | 10 | 20 | 10 | 5 | — | 40 | balance |
| 68 | 50 | 10 | 20 | 10 | 5 | — | 40 | balance |
| 69 | 10 | 1 | 20 | 10 | 5 | — | 40 | balance |
| 70 | 10 | 5 | 20 | 10 | 5 | — | 40 | balance |
| 71 | 10 | 5 | 20 | 10 | 5 | — | 40 | balance |
| 72 | 10 | 10 | 5 | 10 | 5 | — | 40 | balance |
| 73 | 10 | 10 | 50 | 10 | 5 | — | 40 | balance |
| 74 | 10 | 10 | 20 | 0.5 | 5 | — | 40 | balance |
| 75 | 10 | 10 | 20 | 1 | 5 | — | 40 | balance |
| 76 | 10 | 10 | 20 | 50 | 5 | — | 40 | balance |
| 77 | 10 | 10 | 20 | 10 | 0.2 | — | 40 | balance |
| 78 | 10 | 10 | 20 | 10 | 10 | — | 40 | balance |
| 79 | 10 | 10 | 20 | 10 | 5 | — | 5 | balance |
| 80 | 10 | 10 | 20 | 10 | 5 | — | 100 | balance |
| 81 | 1 | 10 | 20 | 10 | — | 10 | 40 | balance |
| 82 | 10 | 10 | 20 | 10 | — | 10 | 40 | balance |
| 83 | 50 | 10 | 20 | 10 | — | 10 | 40 | balance |
| 84 | 10 | 1 | 20 | 10 | — | 10 | 40 | balance |
| 85 | 10 | 5 | 20 | 10 | — | 10 | 40 | balance |
| 86 | 10 | 10 | 20 | 10 | — | 10 | 40 | balance |
| 87 | 10 | 10 | 5 | 10 | — | 10 | 40 | balance |
| 88 | 10 | 10 | 50 | 10 | — | 10 | 40 | balance |
| 89 | 10 | 10 | 20 | 0.5 | — | 10 | 40 | balance |
| 90 | 10 | 10 | 20 | 1 | — | 10 | 40 | balance |
| 91 | 10 | 10 | 20 | 50 | — | 10 | 40 | balance |
| 92 | 10 | 10 | 20 | 10 | — | 0.5 | — | balance |
| 93 | 10 | 10 | 20 | 10 | — | 40 | — | balance |
| 94 | 10 | 10 | 20 | 10 | — | — | 5 | balance |
| 95 | 10 | 10 | 20 | 10 | — | — | 100 | balance |
| 96 | 1 | 10 | 20 | 10 | 5 | 10 | 40 | balance |
| 97 | 10 | 10 | 20 | 10 | 5 | 10 | 40 | balance |

TABLE 6

| | Electrode | | Reliability of Neck Portion | | |
|---|---|---|---|---|---|
| Example | Ball shape | Cracking in Bonding | Heat cycle test Breaking ratio (%) | Vibration test (× 10³ times) | Impact test Breaking ratio (%) |
| 66 | good | good | 0 | 13.0 or more | 2 |
| 67 | good | good | 0 | 13.0 or more | 1 |
| 68 | good | good | 0 | 13.0 or more | 2 |
| 69 | good | good | 0 | 13.0 or more | 13 |
| 70 | good | good | 0 | 13.0 or more | 1 |
| 71 | good | good | 0 | 13.0 or more | 1 |
| 72 | good | good | 0 | 13.0 or more | 1 |
| 73 | good | good | 0 | 13.0 or more | 2 |
| 74 | good | good | 1 | 11.2 | 3 |
| 75 | good | good | 0 | 13.0 or more | 2 |
| 76 | good | good | 0 | 13.0 or more | 1 |
| 77 | good | good | 0 | 13.0 or more | 1 |
| 78 | good | good | 0 | 13.0 or more | 2 |
| 79 | good | good | 0 | 13.0 or more | 2 |
| 80 | good | good | 0 | 13.0 or more | 1 |
| 81 | good | good | 0 | 13.0 or more | 1 |
| 82 | good | good | 0 | 13.0 or more | 2 |
| 83 | good | good | 0 | 13.0 or more | 1 |
| 84 | good | good | 0 | 13.0 or more | 14 |
| 85 | good | good | 0 | 13.0 or more | 2 |
| 86 | good | good | 0 | 13.0 or more | 2 |
| 87 | gdod | good | 0 | 13.0 or more | 1 |
| 88 | good | good | 0 | 13.0 or more | 2 |
| 89 | good | good | 1 | 11.2 | 3 |
| 90 | good | good | 1 | 13.0 or more | 2 |
| 91 | good | good | 1 | 13.0 or more | 1 |
| 92 | good | good | 1 | 13.0 or more | 1 |
| 93 | good | good | 1 | 13.0 or more | 1 |
| 94 | good | good | 1 | 13.0 or more | 2 |
| 95 | good | godd | 1 | 13.0 or more | 2 |
| 96 | good | good | 1 | 13.0 or more | 1 |
| 97 | good | good | 1 | 13.0 or more | 2 |

TABLE 7

| | Composition (ppm by weight) | | | | | | | |
|---|---|---|---|---|---|---|---|---|
| Example | Pt | Ag | Mg | Eu | Be | Ca | Ge | Au |
| 98 | 50 | 10 | 20 | 10 | 5 | 10 | 40 | balance |
| 99 | 10 | 1 | 20 | 10 | 5 | 10 | 40 | balance |
| 100 | 10 | 5 | 20 | 10 | 5 | 10 | 40 | balance |
| 101 | 10 | 50 | 20 | 10 | 5 | 10 | 40 | balance |
| 102 | 10 | 10 | 5 | 10 | 5 | 10 | 40 | balance |
| 103 | 10 | 10 | 50 | 10 | 5 | 10 | 40 | balance |
| 104 | 10 | 10 | 20 | 0.5 | 5 | 10 | 40 | balance |
| 105 | 10 | 10 | 20 | 1 | 5 | 10 | 40 | balance |
| 106 | 10 | 10 | 20 | 50 | 5 | 10 | 40 | balance |
| 107 | 10 | 10 | 20 | 10 | 0.2 | 10 | 40 | balance |
| 108 | 10 | 10 | 20 | 10 | 10 | 10 | 40 | balance |
| 109 | 10 | 10 | 20 | 10 | 5 | 0.5 | 40 | balance |
| 110 | 10 | 10 | 20 | 10 | 5 | 40 | 40 | balance |
| 111 | 10 | 10 | 20 | 10 | 5 | 40 | 5 | balance |
| 112 | 10 | 10 | 20 | 10 | 5 | 40 | 100 | balance |

TABLE 8

| Example | Electrode Ball shape | Cracking in Bonding | Reliability of Neck Portion Heat cycle test Breaking ratio (%) | Vibration test (× $10^3$ times) | Impact test Breaking ratio (%) |
|---|---|---|---|---|---|
| 98 | good | good | 0 | 13.0 or more | 2 |
| 99 | good | good | 0 | 13.0 or more | 15 |
| 100 | good | good | 0 | 13.0 or more | 2 |
| 101 | good | good | 0 | 13.0 or more | 1 |
| 102 | good | good | 0 | 13.0 or more | 2 |
| 103 | good | good | 0 | 13.0 or more | 2 |
| 104 | good | good | 1 | 11.2 | 3 |
| 105 | good | good | 0 | 13.0 or more | 1 |
| 106 | good | good | 0 | 13.0 or more | 2 |
| 107 | good | good | 0 | 13.0 or more | 1 |
| 108 | good | good | 0 | 13.0 or more | 1 |
| 109 | good | good | 0 | 13.0 or more | 2 |
| 110 | good | good | 0 | 13.0 or more | 2 |
| 111 | good | good | 0 | 13.0 or more | 1 |
| 112 | good | good | 0 | 13.0 or more | 2 |

TABLE 9

| Example | Composition (ppm by weight) | | | | | | | |
|---|---|---|---|---|---|---|---|---|
| | Pt | Ag | Mg | Eu | Be | Ca | Ge | La |
| 113 | 1 | 10 | 20 | 10 | — | — | — | 20 |
| 114 | 10 | 10 | 20 | 10 | — | — | — | 20 |
| 115 | 50 | 10 | 20 | 10 | — | — | — | 20 |
| 116 | 10 | 1 | 20 | 10 | — | — | — | 20 |
| 117 | 10 | 5 | 20 | 10 | — | — | — | 20 |
| 118 | 10 | 50 | 20 | 10 | — | — | — | 20 |
| 119 | 10 | 10 | 5 | 10 | — | — | — | 20 |
| 120 | 10 | 10 | 50 | 10 | — | — | — | 20 |
| 121 | 10 | 10 | 20 | 0.5 | — | — | — | 20 |
| 122 | 10 | 10 | 20 | 1 | — | — | — | 20 |
| 123 | 10 | 10 | 20 | 50 | — | — | — | 20 |
| 124 | 10 | 10 | 20 | 10 | — | — | — | 1 |
| 125 | 10 | 10 | 20 | 10 | — | — | — | 200 |
| 126 | 10 | 10 | 20 | 10 | — | — | — | — |
| 127 | 10 | 10 | 20 | 10 | — | — | — | — |
| 128 | 10 | 10 | 20 | 10 | — | — | — | — |
| 129 | 10 | 10 | 20 | 10 | — | — | — | — |
| 130 | 10 | 10 | 20 | 10 | — | — | — | — |
| 131 | 10 | 10 | 20 | 10 | — | — | — | — |
| 132 | 10 | 10 | 20 | 10 | — | — | — | — |
| 133 | 10 | 10 | 20 | 10 | — | — | — | — |
| 134 | 10 | 10 | 20 | 10 | — | — | — | 20 |
| 135 | 10 | 10 | 20 | 10 | — | — | — | 20 |
| 136 | 10 | 10 | 20 | 10 | 0.2 | — | — | 20 |
| 137 | 10 | 10 | 20 | 10 | 5 | — | — | 20 |
| 138 | 10 | 10 | 20 | 10 | 10 | — | — | 20 |
| 139 | 10 | 10 | 20 | 10 | — | 0.5 | — | 20 |
| 140 | 10 | 10 | 20 | 10 | — | 20 | — | 20 |
| 141 | 10 | 10 | 20 | 10 | — | 40 | — | 20 |
| 142 | 10 | 10 | 20 | 10 | — | — | 5 | 20 |
| 143 | 10 | 10 | 20 | 10 | — | — | 100 | 20 |

TABLE 10

| Example | Composition (ppm by weight) | | | | | | | | |
|---|---|---|---|---|---|---|---|---|---|
| | Y | Pb | Er | Gd | Ce | Pr | Nd | Sm | Au |
| 113 | — | — | — | — | — | — | — | — | balance |
| 114 | — | — | — | — | — | — | — | — | balance |
| 115 | — | — | — | — | — | — | — | — | balance |
| 116 | — | — | — | — | — | — | — | — | balance |
| 117 | — | — | — | — | — | — | — | — | balance |
| 118 | — | — | — | — | — | — | — | — | balance |
| 119 | — | — | — | — | — | — | — | — | balance |
| 120 | — | — | — | — | — | — | — | — | balance |
| 121 | — | — | — | — | — | — | — | — | balance |
| 122 | — | — | — | — | — | — | — | — | balance |
| 123 | — | — | — | — | — | — | — | — | balance |
| 124 | — | — | — | — | — | — | — | — | balance |
| 125 | — | — | — | — | — | — | — | — | balance |
| 126 | 20 | — | — | — | — | — | — | — | balance |
| 127 | — | 20 | — | — | — | — | — | — | balance |
| 128 | — | — | 20 | — | — | — | — | — | balance |
| 129 | — | — | — | 20 | — | — | — | — | balance |
| 130 | — | — | — | — | 20 | — | — | — | balance |
| 131 | — | — | — | — | — | 20 | — | — | balance |
| 132 | — | — | — | — | — | — | 20 | — | balance |
| 133 | — | — | — | — | — | — | — | 20 | balance |
| 134 | 20 | — | — | — | — | — | — | — | balance |
| 135 | 20 | 20 | — | — | — | — | — | — | balance |
| 136 | — | — | — | — | — | — | — | — | balance |
| 137 | — | — | — | — | — | — | — | — | balance |
| 138 | — | — | — | — | — | — | — | — | balance |
| 139 | — | — | — | — | — | — | — | — | balance |
| 140 | — | — | — | — | — | — | — | — | balance |
| 141 | — | — | — | — | — | — | — | — | balance |
| 142 | — | — | — | — | — | — | — | — | balance |
| 143 | — | — | — | — | — | — | — | — | balance |

TABLE 11

| | Electrode | | Reliability of Bonding Neck Portion | | |
|---|---|---|---|---|---|
| Example | Ball shape | Cracking in Bonding | Heat cycle test Breaking ratio (%) | Vibration test (× 10³ times) | Impact test Breaking ratio (%) |
| 113 | good | good | 1 | 12.3 | 3 |
| 114 | good | good | 1 | 12.1 | 5 |
| 115 | good | good | 1 | 12.4 | 4 |
| 116 | good | good | 1 | 12.0 | 13 |
| 117 | good | good | 1 | 12.1 | 2 |
| 118 | good | good | 1 | 12.2 | 3 |
| 119 | good | good | 1 | 12.3 | 3 |
| 120 | good | good | 1 | 12.6 | 2 |
| 121 | good | good | 1 | 11.2 | 2 |
| 122 | good | good | 1 | 12.3 | 3 |
| 123 | good | good | 1 | 12.2 | 3 |
| 124 | good | good | 1 | 12.1 | 4 |
| 125 | good | good | 1 | 12.5 | 4 |
| 126 | good | good | 1 | 12.0 | 3 |
| 127 | good | good | 1 | 12.6 | 4 |
| 128 | good | good | 1 | 12.0 | 4 |
| 129 | good | good | 1 | 12.3 | 3 |
| 130 | good | good | 1 | 12.0 | 5 |
| 131 | good | good | 1 | 12.4 | 3 |
| 132 | good | good | 1 | 12.5 | 3 |
| 133 | good | good | 1 | 12.3 | 4 |
| 134 | good | good | 1 | 12.1 | 5 |
| 135 | good | good | 1 | 12.0 | 5 |
| 136 | good | good | 0 | 13.0 or more | 2 |
| 137 | good | good | 0 | 13.0 or more | 1 |
| 138 | good | good | 0 | 13.0 or more | 1 |
| 139 | good | good | 0 | 13.0 or more | 2 |
| 140 | good | good | 0 | 13.0 or more | 1 |
| 141 | good | good | 0 | 13.0 or more | 1 |
| 142 | good | good | 0 | 13.0 or more | 2 |
| 143 | good | good | 0 | 13.0 or more | 1 |

TABLE 12

| | Composition (ppm by weight) | | | | | | | |
|---|---|---|---|---|---|---|---|---|
| Example | Pt | Ag | Mg | Eu | Be | Ca | Ge | La |
| 144 | 10 | 10 | 20 | 10 | 5 | 20 | — | 20 |
| 145 | 10 | 10 | 20 | 10 | 5 | — | 40 | 20 |
| 146 | 10 | 10 | 20 | 10 | — | 20 | 40 | 20 |
| 147 | 10 | 10 | 20 | 10 | 5 | 20 | 40 | 20 |
| 148 | 10 | 10 | 20 | 10 | 5 | 20 | — | 1 |
| 149 | 10 | 10 | 20 | 10 | 5 | 20 | — | 200 |
| 150 | 10 | 10 | 20 | 10 | 5 | 20 | — | — |
| 151 | 10 | 10 | 20 | 10 | 5 | 20 | — | — |
| 152 | 10 | 10 | 20 | 10 | 5 | 20 | — | — |
| 153 | 10 | 10 | 20 | 10 | 5 | 20 | — | — |
| 154 | 10 | 10 | 20 | 10 | 5 | 20 | — | — |
| 155 | 10 | 10 | 20 | 10 | 5 | 20 | — | — |
| 156 | 10 | 10 | 20 | 10 | 5 | 20 | — | — |
| 157 | 10 | 10 | 20 | 10 | 5 | 20 | — | — |
| 158 | 10 | 10 | 20 | 10 | 5 | 20 | — | 20 |
| 159 | 10 | 10 | 20 | 10 | 5 | 20 | — | 20 |

TABLE 13

| | Composition (ppm by weight) | | | | | | | | |
|---|---|---|---|---|---|---|---|---|---|
| Example | Y | Pb | Er | Gd | Ce | Pr | Nd | Sm | Au |
| 144 | — | — | — | — | — | — | — | — | balance |
| 145 | — | — | — | — | — | — | — | — | balance |
| 146 | — | — | — | — | — | — | — | — | balance |
| 147 | — | — | — | — | — | — | — | — | balance |
| 148 | — | — | — | — | — | — | — | — | balance |
| 149 | — | — | — | — | — | — | — | — | balance |
| 150 | 20 | — | — | — | — | — | — | — | balance |
| 151 | — | 20 | — | — | — | — | — | — | balance |
| 152 | — | — | 20 | — | — | — | — | — | balance |
| 153 | — | — | — | 20 | — | — | — | — | balance |
| 154 | — | — | — | — | 20 | — | — | — | balance |
| 155 | — | — | — | — | — | 20 | — | — | balance |
| 156 | — | — | — | — | — | — | 20 | — | balance |
| 157 | — | — | — | — | — | — | — | 20 | balance |
| 158 | 20 | — | — | — | — | — | — | — | balance |
| 159 | 20 | 20 | — | — | — | — | — | — | balance |

TABLE 14

| Example | Ball shape | Electrode Cracking in Bonding | Heat cycle test Breaking ratio (%) | Vibration test (× 10³ times) | Impact test Breaking ratio (%) |
|---|---|---|---|---|---|
| 144 | good | good | 0 | 13.0 or more | 2 |
| 145 | good | good | 0 | 13.0 or more | 2 |
| 146 | good | good | 0 | 13.0 or more | 1 |
| 147 | good | good | 0 | 13.0 or more | 1 |
| 148 | good | good | 0 | 13.0 or more | 2 |
| 149 | good | good | 0 | 13.0 or more | 1 |
| 150 | good | good | 0 | 13.0 or more | 1 |
| 151 | good | good | 0 | 13.0 or more | 2 |
| 152 | good | good | 0 | 13.0 or more | 1 |
| 153 | good | good | 0 | 13.0 or more | 1 |
| 154 | good | good | 0 | 13.0 or more | 2 |
| 155 | good | good | 0 | 13.0 or more | 1 |
| 156 | good | good | 0 | 13.0 or more | 2 |
| 157 | good | good | 0 | 13.0 or more | 2 |
| 158 | good | good | 0 | 13.0 or more | 1 |
| 159 | good | good | 0 | 13.0 or more | 1 |

TABLE 15

| Comparative | Pt | Ag | Mg | Eu | Be | Ca | Ge | Ce | Y | Au |
|---|---|---|---|---|---|---|---|---|---|---|
| 1 | — | — | — | — | — | — | — | — | — | Balance |
| 2 | — | 10 | 20 | 10 | — | — | — | — | — | Balance |
| 3 | — | 10 | 20 | 10 | 5 | — | — | — | — | Balance |
| 4 | — | 10 | 20 | 10 | 5 | — | — | 20 | — | Balance |
| 5 | 10 | — | 20 | 10 | — | — | — | — | — | Balance |
| 6 | 10 | 10 | — | 10 | — | — | — | — | — | Balance |
| 7 | 10 | 10 | — | 10 | 5 | — | — | — | — | Balance |
| 8 | 10 | 10 | — | 10 | — | 10 | — | — | — | Balance |
| 9 | 10 | 10 | — | 10 | — | — | 40 | — | — | Balance |
| 10 | 10 | 10 | — | 10 | 5 | — | — | 20 | — | Balance |
| 11 | 10 | 10 | — | 10 | 5 | 10 | — | 20 | — | Balance |
| 12 | 10 | 10 | 20 | — | — | — | — | — | — | Balance |
| 13 | 10 | 10 | 20 | — | 5 | — | — | — | — | Balance |
| 14 | 10 | 10 | 20 | — | — | 10 | — | — | — | Balance |
| 15 | 10 | 10 | 20 | — | — | — | 40 | — | — | Balance |
| 16 | 10 | 10 | 20 | — | 5 | — | — | 20 | — | Balance |
| 17 | 10 | 10 | 20 | — | 5 | 10 | — | 20 | — | Balance |
| 18 | 10 | 10 | 20 | — | 5 | — | — | 20 | 20 | Balance |
| 19 | 100 | 10 | 20 | 10 | 5 | — | — | 20 | — | Balance |
| 20 | 10 | 100 | 20 | 10 | 5 | — | — | 20 | — | Balance |
| 21 | 10 | 10 | 100 | 10 | 5 | — | — | 20 | — | Balance |
| 22 | 10 | 10 | 20 | 100 | 5 | — | — | 20 | — | Balance |

TABLE 16

| Comparative | Ball shape | Electrode Cracking in Bonding | Heat cycle test Breaking ratio (%) | Vibration test (× 10³ times) | Impact test Breaking ratio (%) |
|---|---|---|---|---|---|
| 1 | good | good | 15 | 6.4 | 38 |
| 2 | good | good | 9 | 8.8 | 36 |
| 3 | good | good | 7 | 9.3 | 34 |
| 4 | good | good | 7 | 9.6 | 33 |
| 5 | good | good | 8 | 9.0 | 37 |
| 6 | good | good | 6 | 10.6 | 27 |

TABLE 16-continued

| | | Measurement Results | | | |
|---|---|---|---|---|---|
| | | Electrode | Reliability of Bonding Neck Portion | | |
| Comparative | Ball shape | Cracking in Bonding | Heat cycle test Breaking ratio (%) | Vibration test (× 10³ times) | Impact test Breaking ratio (%) |
| 7 | good | good | 5 | 10.5 | 25 |
| 8 | good | good | 5 | 10.5 | 25 |
| 9 | good | good | 5 | 10.4 | 24 |
| 10 | good | good | 5 | 10.3 | 24 |
| 11 | good | good | 5 | 10.0 | 21 |
| 12 | good | good | 7 | 9.8 | 35 |
| 13 | good | good | 6 | 10.2 | 20 |
| 14 | good | good | 6 | 10.5 | 25 |
| 15 | good | good | 6 | 10.3 | 24 |
| 16 | good | good | 6 | 10.6 | 27 |
| 17 | good | good | 6 | 10.1 | 22 |
| 18 | good | good | 6 | 10.4 | 24 |
| 19 | bad | good | 2 | 11.5 | 13 |
| 20 | bad | good | 2 | 11.5 | 13 |
| 21 | bad | bad | 2 | 11.6 | 14 |
| 22 | good | bad | 2 | 11.3 | 12 |

As is evident from the above measurement results, in Examples 1 to 11 using predetermined amounts of the first group components, Pt, Ag, Mg and Eu, the ball shape is good and electrode cracking hardly occurs at the time of bonding; besides, the breaking ratio after the heat cycle test is 1%, the number of times of oscillation up to breaking in the vibration test was 11,000 times or more and the breaking ratio under the impact test is 12% or less, thus exhibiting an excellent effect in the improvement of reliability of the ball neck portion.

Above all, in Examples wherein the content of Eu is 0.0001 wt % or more, the number of times of oscillation up to breaking in the vibration test is 12,000 times or more and in Examples wherein the content of Ag is 0.0005 wt % or more, the breaking ratio under the impact test is 5% or less, thus exhibiting a superior effect in improving the reliability of the ball neck portion.

In examples 12 to 112 using at least one member selected from the second group components of Be, Ca and Ge in addition to the first group components, the ball shape is good, with no electrode cracking in bonding, the breaking ratio after the heat cycle test is not higher than 1%, and the number of times of oscillation up to breaking in the vibration test is 11,000 times or more and the breaking ratio under the impact test is 15% or less, thus exhibiting an excellent effect.

Particularly, in Examples having an Eu content of 0.0001 wt % or more, the breaking ratio after the heat cycle test is 0% and the number of times of oscillation up to breaking in the vibration test is 13,000 times, and in Examples wherein the content of Ag is 0.0005 wt % or more, the breaking ratio under the impact test is 3% or less, thus exhibiting a more excellent effect in improving the reliability of the ball neck portion.

Further, in Examples 113 to 135 using at least one of the third group components of La, Y, Pb, Er, Gd, Ce, Pr, Nd and Sm in a predetermined amount in addition to the first group components, an equal effect is attained to that attained in Examples 1 to 11 using only the first group of components.

In examples 136 to 159 using at least one of the third group of components of La, Y, Pb, Er, Gd, Ce, Pr, Nd and Sm in a predetermined amount in addition to the first and second group components, an equal or superior effect is attained to that attained in Examples 11 to 112 using both first and second group components.

On the other hand, in comparative example 1 using none of the first to the third group components, the breaking ratio after the heat cycle test is 15%, the number of times of oscillation up to breaking in the vibration test is 6,400 times or so and the breaking ratio under the breaking test is 38%.

In comparative examples 2 to 18 containing none of the first group components, the breaking ratio after the heat cycle test is 5% to 9% and the number of times of oscillation up to breaking in the vibration test is 8,800 times or more and 10,600 times or less and the breaking ratio under the impact test is 20 to 37%. Thus it turns out that these comparative examples are inferior to the present invention though improved over Comparative Example 1.

Further, comparative examples 19 to 22 using all of the first group components but with the amount of any one of those components being outside the range specified therein are inferior to the present invention in point of either ball shape or chip electrode cracking though similar to the present invention in point of breaking ratio after the heat cycle test which is 2% and the number of times of oscillation up to breaking in the vibration test which is 11,000 times or more and the breaking ratio under the breaking test is 12 to 14%.

As set forth, since the gold wire for IC chip bonding in the first aspect of the present invention has a composition consisting essentially of predetermined amounts of Pt, Ag, Mg and Eu; with the balance being Au, said Au having less than 0.001% by weight of incidental impurity, it is superior in the breaking performance thereof when exposed to a heat cycle environment, vibration and impact can be greatly improved, in the neck portion of a loop formed by reverse deformation after thermosonic wire bonding at an enhanced ultrasonic output.

Therefore, a high reliability is attained in the assembly of a semiconductor device wherein wiring is short despite the use of many lead wires, and this point is extremely useful in promoting speed-up, higher function and reduction of both size and wall thickness of a semiconductor device.

Further, in the case of the gold wire for IC chip bonding in the second aspect of the present invention has a composition consisting essentially of predetermined amounts of Pt, Ag, Mg and Eu and further containing at least one of Be, Ca and Ge in a predetermined amount, with the balance being Au, and said Au having less than 0.001% by weight of incidental impurity, there can be attained a further improvement in breaking performance when exposed to a heat cycle environment, vibration and impact, in the neck portion of a loop formed by reverse deformation after thermosonic output. Thus, the foregoing effects could be further enhanced.

Further, in the case of the gold wire for IC chip bonding in the third aspect of the present invention has a composition consisting essentially of predetermined amounts of Pt, Ag, Mg and Eu and further containing at least one of La, Y, Pb, Er, Gd, Ce, Pr, Nd, Sm in a predetermined amount, with the balance being Au, and said Au having less than 0.001% by weight of incidental impurity. Thus, the same effects as the foregoing effects in the first aspect of the present invention could be attained.

Further, in the case of the gold wire for IC chip bonding in the fifth aspect of the present invention has a composition consisting essentially of predetermined amounts of Pt, Ag, Mg and Eu, further containing at least one of La, Y, Pb, Er, Gd, Ce, Pr, Nd, Sm in a predetermined amount and further containing at least one of Be, Ca and Ge in a predetermined amount, with the balance being Au, and said Au having less than 0.001% by weight of incidental impurity. Thus, the same effects as the foregoing effects in the second aspect of the present invention could be attained.

Further, in the case of the gold wire for IC chip bonding in the fifth to eighth aspects of the present invention have the lowest limit amount of a composition Ag in each of the aforementioned first, second, third and fourth inventions is 0.0005 wt %, in the neck portion of loop forming by a thermosonic wire bonding in which increase an ultrasonic output and performing the reverse deformation, it is superior in the breaking performance thereof when exposed to vibration and impact can be greatly improved and the aforementioned effect can be further effective.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope and spirit of the invention as defined by the appended claims.

What is claimed is:

1. A fine gold alloy wire for use in the bonding of an IC chip, consisting essentially of from 0.0001 to 0.005% by weight of Pt; from 0.0001 to 0.005% by weight of Ag; from 0.0005 to 0.005% by weight of Mg; and from 0.00005 to 0.005% by weight of Eu; with the balance being Au, said Au having less than 0.001% by weight of incidental impurity.

2. A fine gold alloy wire for use in the bonding of an IC chip consisting essentially of from 0.0001 to 0.005% by weight of Pt; from 0.0001 to 0.005% by weight of Ag; from 0.0005 to 0.005% by weight of Mg; from 0.00005 to 0.005% by weight of Eu; and at least one additional element selected from the group consisting of from 0.00002 to 0.001% by weight of Be, from 0.00005 to 0.004% by weight of Ca, and from 0.0005 to 0.01% by weight of Ge, with the balance being Au, said Au having less than 0.001% by weight of incidental impurity.

3. A fine gold alloy wire for use in the bonding of an IC chip consisting essentially of from 0.0001 to 0.005% by weight of Pt; from 0.0001 to 0.005% by weight Of Ag; from 0.0005 to 0.005% by weight of Mg; from 0.00005 to 0.005% by weight of Eu; and from 0.0001 to 0.02% by weight of at least one additional element selected from the group consisting of La, Y, Pb, Er, Gd, Ce, Pr, Nd and Sm, with the balance being Au, said Au having less than 0.001% by weight of incidental impurity.

4. A fine gold alloy wire for use in the bonding of an IC chip consisting essentially of from 0.0001 to 0.005% by weight of Pt; from 0.0001 to 0.005% by weight of Ag; from 0.0005 to 0.005% by weight of Mg; from 0.00005 to 0.005% by weight of Eu; and from 0.0001 to 0.02% by weight of at least one additional element selected from the group consisting of from 0.00002 to 0.001% by weight of Be, from 0.00005 to 0.004% by weight of Ca, and from 0.0005 to 0.01% by weight of Ge; and from 0.0001 t0 0.02% by weight of at least one other additional element selected from the group consisting of La, Y, Pb, Er, Gd, Ce, Pr, Nd and Sm, with the balance being Au, said Au having less than 0.001% by weight of incidental impurity.

5. A fine gold alloy wire for use in the bonding of an IC chip according to claim 1, wherein the Ag content is from 0.0005 to 0.005% by weight.

6. A fine gold alloy wire for use in the bonding of an IC chip according to claim 2, wherein the Ag content is from 0.0005 to 0.005% by weight.

7. A fine gold alloy wire for use in the bonding of an IC chip according to claim 3, wherein the Ag content is from 0.0005 to 0.005% by weight.

8. A fine gold alloy wire for use in the bonding of an IC chip according to claim 4, wherein the Ag content is from 0.0005 to 0.005% by weight.

* * * * *